United States Patent
Kar et al.

(10) Patent No.: US 9,437,783 B2
(45) Date of Patent: Sep. 6, 2016

(54) LIGHT EMITTING DIODE (LED) CONTACT STRUCTURES AND PROCESS FOR FABRICATING THE SAME

(75) Inventors: Pritish Kar, Cary, NC (US); David Beardsley Slater, Jr., Durham, NC (US); Matthew Donofrio, Raleigh, NC (US); Brad Williams, Cary, NC (US)

(73) Assignee: Cree, Inc., Durham, NC (US)

( * ) Notice: Subject to any disclaimer, the term of this patent is extended or adjusted under 35 U.S.C. 154(b) by 213 days.

(21) Appl. No.: 13/466,590

(22) Filed: May 8, 2012

(65) Prior Publication Data

US 2013/0299858 A1  Nov. 14, 2013

(51) Int. Cl.
| | |
|---|---|
| H01L 21/00 | (2006.01) |
| H01L 33/40 | (2010.01) |
| H01L 33/22 | (2010.01) |
| H01L 33/32 | (2010.01) |
| H01L 33/38 | (2010.01) |

(52) U.S. Cl.
CPC ............... *H01L 33/40* (2013.01); *H01L 33/22* (2013.01); *H01L 33/32* (2013.01); *H01L 33/382* (2013.01); *H01L 2933/0016* (2013.01)

(58) Field of Classification Search
CPC ........... H01L 33/40; H01L 2933/0016; H01L 33/382; H01L 33/32; H01L 33/22
USPC .......................... 257/98–99, 79, 96
See application file for complete search history.

(56) References Cited

U.S. PATENT DOCUMENTS

| | | | |
|---|---|---|---|
| 5,930,610 A * | 7/1999 | Lee ............................... | 438/182 |
| 6,791,119 B2 | 9/2004 | Slater, Jr. et al. | |
| 7,335,920 B2 | 2/2008 | Denbaars et al. | |
| 7,557,380 B2 | 7/2009 | Haberern et al. | |
| 7,759,670 B2 * | 7/2010 | Liu ........................ | H01L 33/38 257/101 |
| 8,334,153 B2 * | 12/2012 | Gotoda et al. .................. | 438/29 |
| 8,624,283 B2 * | 1/2014 | Kim ................................ | 257/98 |
| 8,653,547 B2 * | 2/2014 | Jeong et al. .................... | 257/96 |
| 2004/0187303 A1 | 9/2004 | LaPlante et al. | |
| 2005/0215000 A1 | 9/2005 | Negley | |
| 2007/0114552 A1 | 5/2007 | Jang et al. | |
| 2008/0048206 A1 | 2/2008 | Lee et al. | |
| 2008/0087996 A1 | 4/2008 | Miyaki et al. | |

(Continued)

FOREIGN PATENT DOCUMENTS

WO   WO 2011/151961 A1   12/2011

OTHER PUBLICATIONS

International Search Report and Written Opinion for PCT/US2013/039667 mailed Sep. 9, 2013.

(Continued)

*Primary Examiner* — Laura Menz
(74) *Attorney, Agent, or Firm* — Myers Bigel & Sibley, PA (57) ABSTRACT

A light emitting device includes an active layer configured to provide light emission due to carrier recombination therein, a surface on the active layer, and an electrically conductive contact structure on the surface. The contact structure includes at least one plated contact layer. The contact structure may include a sublayer that conforms to the surface roughness of the underlying surface, and the plated contact layer may be substantially free of the surface roughness of the underlying surface. The surface of the plated contact layer may be substantially planar and/or otherwise configured to reflect the light emission from the active layer. Related fabrication methods are also discussed.

22 Claims, 9 Drawing Sheets

(56) References Cited

U.S. PATENT DOCUMENTS

| | | |
|---|---|---|
| 2009/0283787 A1 | 11/2009 | Donofrio et al. |
| 2010/0006884 A1 | 1/2010 | Ou et al. |
| 2010/0105204 A1 | 4/2010 | Lam et al. |
| 2010/0203661 A1* | 8/2010 | Hodota ............... H01L 33/0079 438/29 |
| 2011/0079813 A1 | 4/2011 | Yeol et al. |
| 2011/0220926 A1 | 9/2011 | Kim |
| 2011/0220935 A1 | 9/2011 | Gotoda et al. |
| 2011/0233558 A1* | 9/2011 | Lee ........................ H01L 33/04 257/76 |
| 2012/0012869 A1 | 1/2012 | Song |
| 2012/0025251 A1 | 2/2012 | Kazama |
| 2012/0049232 A1 | 3/2012 | Okabe et al. |

OTHER PUBLICATIONS

International Preliminary Report on Patentability for PCT/USUS2013/039667 mailed Nov. 20, 2014.

* cited by examiner

LIGHT EMITTING DIODE (LED) CONTACT STRUCTURES AND PROCESS FOR FABRICATING THE SAME

BACKGROUND

This invention relates to semiconductor devices and methods of manufacturing the same, and more particularly, to semiconductor light emitting devices and methods of manufacturing the same.

Light emitting diodes and laser diodes are well known solid state lighting elements capable of generating light upon application of a sufficient current. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip or die includes a substrate and a diode region including an n-type layer, a p-type layer and a p-n junction. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. An anode contact may ohmically contact the p-type layer of the device (typically, an exposed p-type epitaxial layer) and a cathode contact may ohmically contact an n-type layer of the device (such as the substrate or an exposed n-type epitaxial layer).

When a potential is applied to the contacts, electrons may be injected into the active region from the n-type layer and holes may be injected into the active region from the p-type layer. The radiative recombination of electrons and holes within the active region generates light. Some LED chips include an active region with multiple light emitting regions or active layers (also known as multi-quantum-well structures) between or near the junction of the n-type and p-type layers. The light radiated by the LED may be in the visible or ultraviolet (UV) regions, and the LED may incorporate wavelength conversion material such as phosphor.

LEDs are increasingly being used in lighting/illumination applications, with a goal being to provide a replacement for the ubiquitous incandescent light bulb.

SUMMARY

According to some embodiments of the present invention, a light emitting device includes an active layer configured to provide light emission, a surface on the active layer, and an electrically conductive contact structure including at least one plated layer on the surface.

In some embodiments, the contact structure further includes a conductive seed layer between the plated contact layer and the surface on the active layer. The conductive seed layer may include at least one sputtered or evaporated layer.

In some embodiments, the seed layer may conform to a surface roughness of the surface on the active layer. A surface of the plated contact layer opposite the seed layer may be substantially free of the surface roughness.

In some embodiments, a surface roughness of a surface of the seed layer may be more than about 50% of that of the surface on the active layer. A surface roughness of the surface of the plated contact layer may be less than about 10% of that of the surface on the active layer.

In some embodiments, the surface on the active layer may include a plurality of features protruding therefrom, and a surface of the plated contact layer opposite the active layer may be substantially planar. For example, the features may protrude from the surface on the active layer by more than about 0.5 micrometers ($\mu m$). The plated contact layer may have a thickness of about 8 micrometers ($\mu m$) or less.

In some embodiments, a surface of the plated contact layer may have a greater reflectivity with respect to the light emission than that of the seed layer.

In some embodiments, the surface on the active layer may be a light extraction surface. The light extraction surface may include a plurality of light extraction features protruding therefrom. In some embodiments, the light extraction surface may be a surface of an epitaxial layer or a surface of a substrate including the active layer thereon.

In some embodiments, the plated contact layer may include gold or an alloy thereof.

In some embodiments, the seed layer may include a layer of gold or an alloy thereof. In some embodiments, the seed layer may further include a layer of titanium or an alloy thereof between the layer of gold and the surface on the active layer. In some embodiments, the seed layer may still further include a layer of aluminum or an alloy thereof between the titanium layer and the surface on the active layer.

In some embodiments, the plated layer may be a stack including multiple plated layers. In some embodiments, the plated layer may further include respective barrier layers between adjacent ones of the multiple plated layers in the stack. In some embodiments, the multiple plated layers may respectively include gold, silver, tungsten, palladium, rhenium, copper, titanium, platinum, chromium, nickel, aluminum, and/or alloys thereof.

In some embodiments, the seed layer may be a stack including multiple layers. The multiple layers may respectively include gold, aluminum, titanium, tungsten, chromium, nickel, platinum, and/or alloys thereof.

In some embodiments, at least one sidewall of the contact structure may be inclined relative to the surface on the active layer. In some embodiments, at least one sidewall of the plated contact layer and/or the seed layer may be inclined relative to the surface of the active layer. In some embodiments, an angle of incline of the sidewalls of the plated contact layer may be the same as or different than that of the seed layer. In some embodiments, a base of the plated contact layer adjacent the surface of the active layer may be wider than a surface of the plated contact layer opposite the surface of the active layer.

According to further embodiments of the present invention, a light emitting device includes an active layer configured to provide photon emission due to carrier recombination therein, a light extraction surface on the active layer, and an electrically conductive contact structure on the light extraction surface. The light extraction surface includes a plurality of light extraction features protruding therefrom that define a surface roughness thereof. The contact structure includes at least one sublayer having a surface that conforms to the surface roughness of the light extraction surface, and a surface that is substantially free of the surface roughness of the light extraction surface.

In some embodiments, the surface of the contact structure may be a plated metal layer on the at least one sublayer opposite the light extraction surface.

In some embodiments, the sublayer may be a seed layer including at least one sputtered or evaporated metal layer between the plated metal layer and the light extraction surface.

In some embodiments, the seed layer may have a thickness of about 0.3 micrometers ($\mu m$) or less, and the plated metal layer may be a substantially planar layer having a thickness of about 8 micrometers ($\mu m$) or less.

In some embodiments, the surface of the sublayer may have a surface roughness of more than about 50% of that of the light extraction surface, and the surface of the contact structure may have a surface roughness of less than about 10% of that of the light extraction surface.

According to still further embodiments of the present invention, a method of fabricating a light emitting device includes providing a surface on an active layer that is configured to provide light emission, and performing a plating process to deposit an electrically conductive contact layer on the surface.

In some embodiments, an electrically conductive seed layer may be deposited on the surface prior to performing the plating process.

In some embodiments, performing the plating process may include providing a mask structure on the surface. The mask structure may include an opening therein exposing a portion of the seed layer. The contact layer may be plated to the exposed portion of the seed layer without depositing the contact layer outside the opening.

In some embodiments, the mask structure may include a first mask layer, a second mask layer, and portions of the seed layer sandwiched therebetween such that a surface of the mask structure outside the opening is free of the seed layer.

In some embodiments, providing the mask structure and depositing the seed layer may include forming the first mask layer including a preliminary opening therein exposing the surface, performing a sputtering or evaporation process to deposit the seed layer on the first mask layer and on the surface exposed by the preliminary opening, and forming the second mask layer on the first mask layer including the seed layer thereon to define the opening exposing the portion of seed layer.

In some embodiments, the surface on the active layer may include a plurality of features protruding therefrom, and a surface of the plated contact layer opposite the active layer may be substantially planar.

In some embodiments, the surface on the active layer may be a light extraction surface. A surface of the plated contact layer may have a greater reflectivity with respect to the light emission than that of the seed layer.

According to yet further embodiments of the present invention, a method of fabricating a light emitting device includes providing a multiple layer mask structure, such as a bi-layer mask structure comprising a first mask layer, a second mask layer, and a seed layer sandwiched therebetween on a light extraction surface. The mask structure includes an opening therein exposing a portion of the seed layer on the light extraction surface therebelow. A plating process is performed to deposit an electrically conductive contact layer in the opening on the exposed portion of the seed layer.

In some embodiments, in providing the bi-layer mask structure, the first mask layer is formed to include a preliminary opening therein exposing the light extraction surface. The seed layer is deposited on the first mask layer and on the light extraction surface exposed by the preliminary opening. A second mask layer is formed on the first mask layer including the seed layer thereon to define the opening exposing the portion of seed layer.

In some embodiments, the seed layer may be deposited by performing a sputtering or evaporation process to conformally deposit the seed layer on the first mask layer and on the light extraction surface exposed by the preliminary opening. The seed layer may be an electrically continuous layer extending on the first mask layer and on sidewalls of the preliminary opening therein. The second mask layer may be negatively biased relative to the first mask layer such that portions of the seed layer on the sidewalls of the preliminary opening are covered by the second mask layer to prevent plating thereto.

In some embodiments, the light extraction surface may include a plurality of features protruding therefrom that define a surface roughness thereof. The portion of the seed layer may conform to the surface roughness, and a surface of the contact layer opposite the light extraction surface may be substantially free of the surface roughness.

In some embodiments, the surface of the contact layer may be a substantially planar surface having a greater reflectivity than that of the portion of the seed layer thereon.

According to yet further embodiments of the present invention, a method of fabricating a semiconductor device includes providing a mask structure having an opening therein exposing a portion of a seed layer on a surface therebelow, where portions of the mask structure outside the opening are free of the seed layer, and performing a plating process to deposit an electrically conductive contact layer in the opening on the exposed portion of the seed layer.

In some embodiments, the mask structure may be a bi-layer mask including a first mask layer and a second mask layer stacked on the surface. Portions of the seed layer that are not exposed by the opening may be sandwiched between the first and second mask layers.

In some embodiments, the semiconductor device may be a light emitting device. In some embodiments, the surface may be a light extraction surface on at least one active layer that is configured to provide photon emission due to carrier recombination therein.

In some embodiments, the light extraction surface may include a plurality of features protruding therefrom that define a surface roughness thereof. The seed layer may conform to the surface roughness of the light extraction surface, and a surface of the contact layer may be substantially free of the surface roughness of the light extraction surface.

In some embodiments, a surface of the contact layer opposite the light extraction surface may be substantially planar, may have a greater reflectivity than that of the portion of the seed layer thereon, and/or may have a surface roughness that is less than about 10% of that of the light extraction surface.

Other methods, systems, and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size or thickness and relative sizes or thicknesses of regions and layers may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the Figures. It will be understood that these terms are intended to encompass different orientations of the device in addition to the orientation depicted in the Figures. Finally, the term "directly" means that there are no intervening elements. As used herein, the term "and/or" includes any and all combinations of one or more of the associated listed items.

It will also be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the Figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, the term "light emitting device" may include a light emitting diode, laser diode and/or other semiconductor device which includes one or more semiconductor layers, which may include silicon, silicon carbide, gallium nitride and/or other semiconductor materials. A light emitting device may or may not include a substrate such as a sapphire, silicon, silicon carbide, gallium nitride, and/or other microelectronic substrates. A light emitting device may include one or more contact layers or structures which may include metal and/or other conductive layers.

Various embodiments described herein may arise from recognition that, in the fabrication of contact layers in light emitting devices, deposition processes (such as evaporation and/or sputtering processes) that use a single layer of resist to form metal contact layers typically result in deposition of the metal on an entire wafer surface, as well as on secondary surfaces (e.g., the surfaces of the resist) and the fixtures used to hold the wafer. Such deposition processes may thereby require the use of significantly more metal than is ultimately deposited on the wafer, and may also require an additional reclamation process to reclaim the metal deposited on the secondary surfaces. Furthermore, in light emitting devices where contact layers are provided on a surface through which light is emitted (also referred to herein as a light extraction surface), the areas of the light extraction surface covered by the contact layers may not contribute to light emission, thereby reducing overall light output.

Accordingly, some embodiments of the present invention provide plating processes whereby the contact metal may not be deposited on secondary surfaces, but rather, may only be deposited on the desired areas of the wafer. Embodiments of the present invention may thereby eliminate the need for subsequent reclamation processes, and may reduce metal consumption by over 90% as compared to traditional deposition methods. Embodiments of the present invention also allow for LED contact structure formation in a manner such that the surface of the contact layer has sufficient reflectivity to enhance light output. In particular, some embodiments of the present invention provide contact layers having surface characteristics that are smoother (e.g., having a lower surface roughness) than an underlying light extraction surface, particularly when the light extraction surface is patterned or textured. For example, some embodiments of the present invention provide for metal contact layer formation using a plating process and a bi-layer resist, whereby a seed layer is sandwiched between two layers of resist such that the seed layer is only exposed in desired areas for plating. The seed layer may act as the seed for an electroplating process, and the resulting surface of the metal contact layer may be smoother than that which may be achieved by a sputtering and/or evaporation process. As such, contact layers formed in accordance with embodiments of the present invention may have enhanced reflectivity, and thus, may enhance light production due to outward reflection of light that might otherwise be absorbed internally.

Figure 1:
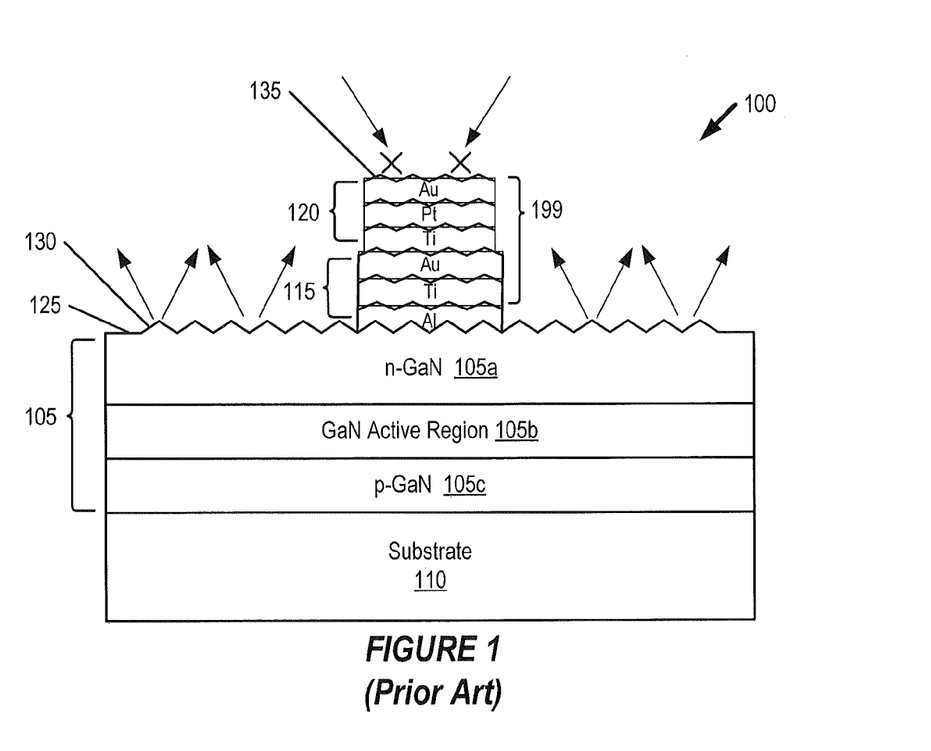
FIG. 1 is a cross-sectional view illustrating a conventional LED contact structure.

FIG. 1 is a cross-sectional view illustrating a conventional contact structure for a gallium nitride (GaN)-based LED. As shown in FIG. 1, an LED wafer 100 includes a diode region 105 provided on a substrate 110. The diode region 105 includes an n-type GaN layer 105a, a p-type GaN layer 105c, and a GaN active region 105b therebetween. The active region 105b may include one or more quantum well layers and barrier layers configured to provide photon emission due to carrier recombination therein. Light generated in the active region 105b is emitted from a surface 125, referred to herein as a light extraction surface. A shown in FIG. 1, the light extraction surface 125 is a patterned or textured to define light extraction features 130 that may enhance light extraction. The light extraction features 130 thereby define a surface roughness of the light extraction surface 125.

Still referring to FIG. 1, a metal seed layer 115 including an aluminum (Al) layer, a titanium (Ti) layer, and a gold (Au) layer is deposited on the light emitting surface 125, using a sputtering or evaporation process. For example, a single layer resist may be formed on the light extraction surface 125 to expose a portion thereof, and the Al/Ti/Au seed layer 115 may be sputtered on the exposed portion of the light extraction surface. The seed layer 115 may provide a good ohmic contact to the epitaxially grown n-GaN layer 105a. A metal contact layer 120 (illustrated as a titanium/platinum/gold contact layer) is then deposited on the seed layer 115, for example, also using a sputtering or evaporation process. The seed layer 115 and the contact layer 120 thereon define a contact structure 199 on the light emitting surface 125. However, as shown in FIG. 1, the surface 135 of the contact layer 120 is substantially non-planar, as the surface 135 retains some of the surface roughness 130 of the underlying light extraction surface 125 on which the contact layer 120 is deposited. For example, the surface 135 of the contact layer 120 may retain about 50% or more of the surface roughness of the underlying light extraction surface 125. As such, the contact structure 199 not only prevents light extraction from the portion of the light extraction surface 125 covered thereby, but also provides poor reflectivity for outwardly redirecting light emitted by the active region 105b (as illustrated by the arrows in FIG. 1).

Figure 2:
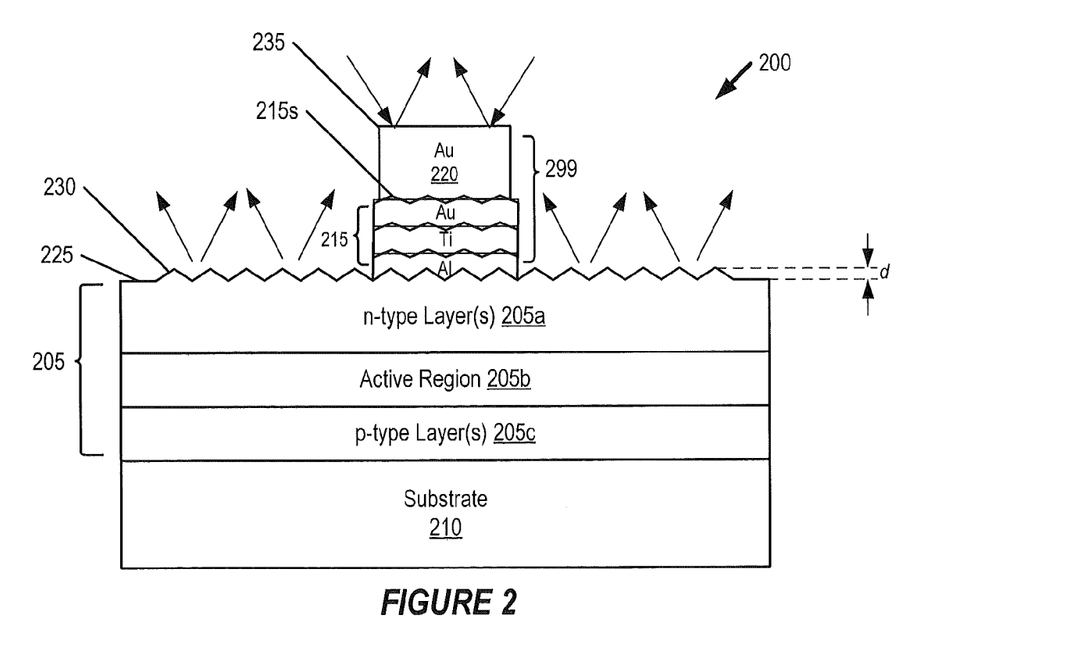
FIG. 2 is a cross-sectional view illustrating LED contact structures in accordance with some embodiments of the present invention.

FIG. 2 is a cross-sectional view illustrating LED contact structures in accordance with some embodiments of the present invention. Referring now to FIG. 2, an LED wafer 200 includes a diode region 205 on a substrate 210. The diode region 205 includes at least one n-type layer 205a, an active region 205b, and at least one p-type layer 205c. In some embodiments, the diode region 205 including the n-type layer 205a, the active region 205b, and the p-type layer 205c may be gallium nitride-based semiconductor layers, including alloys thereof such as indium gallium nitride (InGaN) and/or aluminum indium gallium nitride (AlInGaN). A p-n junction is defined between the n-type layer 205a and the p-type layer 205c, and either or both layers may be at respective surfaces of the diode region 205 or may be buried within the diode region 205. It will also be understood that other layers, such as a buffer layer or layers, may also be provided in or on the diode region 205; however, such layers need not be described further herein.

The active region 205b may include one or more layers that are configured to provide light emission. For example, the active region 205b may be a single layer of n-type, p-type, or intrinsic gallium nitride based materials, another homostructure, a single heterostructure, a double heterostructure, and/or a single- or multi-quantum well structure. The active region 205b may be a light emitting layer bounded by one or more cladding layers. For example, the active region 205b may include at least one indium gallium nitride quantum well layer, the n-type layer 205a may include silicon-doped gallium nitride, and the p-type layer 205c may include magnesium-doped gallium nitride. As such, radiative recombination of electrons that are injected into the active region 205b from the n-type layer 205a and holes that are injected into the active region 205b from the p-type layer 205c may result in photon emission from the active region 205b.

The diode region 205 may also be referred to herein as an "LED epi region," because it is typically formed epitaxially on a substrate. For example, a Group III-nitride based LED epi region may be formed on a silicon carbide (SiC) growth substrate. In some embodiments, the growth substrate may be present in the finished product. For example, in embodiments where a transparent SiC growth substrate is used, the growth substrate may be patterned as described herein to provide the light extraction surface 225 described in greater detail below. However, in the embodiment shown in FIG. 2, the growth substrate has been removed, and the LED epi region 205 is bonded to a carrier substrate 210 different from the growth substrate. The LED epi region 205 may also define a plurality of LED dies.

Still referring to FIG. 2, a surface 225 of the diode region 205 defines a light extraction surface through which light generated in the active region 205b is emitted. The light extraction surface 225 is patterned, textured, and or otherwise roughened to enhance light extraction therefrom. For example, as shown in FIG. 2, the surface 225 includes a plurality of light extraction FIG. 230 protruding therefrom. In some embodiments, grooves, bevels, and/or ridges may be provided in the surface 225, as described for example in commonly assigned U.S. Pat. No. 6,791,119 entitled "Light Emitting Diodes Including Modifications for Light Extraction," the disclosure of which is hereby incorporated by reference as if set forth fully herein. The surface 225 may also be etched to improve light extraction using, for example, etch processes as described in commonly assigned U.S. Patent Publication No. 2005/0215000 entitled "Etching Of Substrates Of Light Emitting Diodes," the disclosure of which is hereby incorporated by reference as if set forth fully herein. The light extraction features 230 may thus provide a surface roughness that may enhance light extraction from the diode region 205 by increasing the probability that incident light emitted by the active region 205b is transmitted through the surface 225 instead of being internally reflected. In some embodiments, the light extraction features 230 may protrude from the light extraction surface 225 by a distance d of about 0.5 micrometers ($\mu m$) to about 6 $\mu m$, as measured from peak-to-valley. In some embodiments, the light extraction features 230 may protrude by a distance d of more than about 1.2 $\mu m$. Also, although FIG. 2 illustrates the light extraction surface 225 as a surface of an n-type layer 205a of the diode region 205 by way of example, it will be understood that the light extraction surface 225 may be a surface of a p-type layer 205b of the diode region 205, or may be a surface of another layer or substrate that is provided on the diode region 205 without departing from the teachings of the present invention.

A seed layer 215 (illustrated as an Al/Ti/Au seed layer) is provided on the light extraction surface 225 including the light extraction features 230 protruding therefrom. For example, the seed layer 215 may be deposited on the light extraction surface 225 by an evaporation or sputtering process. The seed layer 215 may allow for improved ohmic contact to the n-type layer(s) 205a of the LED epi region 205, and may be deposited to a thickness of about 3000 angstroms (Å) (0.3 µm) in some embodiments (e.g., about 1000 Å or 0.1 µm for each of the Al, Ti, and Au layers). The seed layer 215 may be a single layer or a composite layer (such as the Al/Ti/Au layer of FIG. 2). As shown in FIG. 2, a surface 215s of the deposited seed layer 215 is non-planar, retaining at least some of the surface roughness of the underlying light extraction surface 225 defined by the protruding light extraction features 230. In particular, the sputtering or evaporating process may conformally deposit the seed layer 215 onto the light extraction surface 225 such that the surface 215s of the seed layer 215 includes at least a portion of the underlying surface roughness. In some embodiments, the seed layer 215 may have a surface roughness of more than about 50% of that of the underlying light extraction surface 225.

An electrically conductive contact layer 220 is provided on the surface of the seed layer 215 to define a contact structure 299, for example, using fabrication methods as described in greater detail herein. In particular, the contact layer 220 may be a plated layer, such that the contact structure 299 may include the seed layer 215 and the plated contact layer 220 thereon. The contact layer 220 may be a single layer (such as the gold layer shown in FIG. 2) or a composite layer. As such, the contact layer(s) 220 and the seed layer(s) 215 may define sublayers of the contact structure 299. The contact structure 299 including the contact layer 220 and the seed layer 215 may define cathode contact to the n-type layer 205a. However, it will be understood that embodiments of the present invention may be applied to any type of conductive contact structure; thus, the contact structure 299 may define an anode contact to the p-type layer 205c of the LED wafer 200 in some embodiments. The contact layer 220 may be deposited to a thickness of about 8 µm or less in some embodiments. In other embodiments, the contact layer 220 may have a thickness of less than about 50 µm.

However, as shown in FIG. 2, the surface characteristics of the contact layer 220 differ from and are substantially independent of that of the underlying surfaces on which it is formed. In particular, the surface 235 of the contact layer 220 has a surface roughness of less than about 10% of that of the patterned light extraction surface 225 and/or that of the deposited seed layer surface 215s. In some embodiments, the surface 235 of the contact layer 220 may retain less than about 15% of the surface roughness of the underlying light extraction surface 225, while in other embodiments the surface 235 may retain about 5% or less of the surface roughness of the underlying light extraction surface 225. The reduced surface roughness of the contact layer 220 may be achieved by the electroplating processes described in greater detail below. As such, the surface 235 of the contact layer 220 may be substantially planar and/or otherwise more reflective with respect to light in the wavelength ranges emitted by the active region 205b (represented by the arrows illustrated in FIG. 2) than the underlying surface 215s of the seed layer 215 on which the contact layer 220 is formed. In some embodiments, the surface 235 of the contact layer 225 may have a reflectivity of about 50% or more than the surface 215s of the seed layer 215. Moreover, the surface 235 of the contact layer 220 in accordance with embodiments of the present invention may have a reduced surface roughness and/or may otherwise provide greater reflectance than the surface of a contact layer formed by a sputtering and/or evaporation process, such as the surface 135 of the contact layer 120 of FIG. 1. While illustrated as a gold (Au) contact layer in FIG. 2, more reflective metals, such as aluminum (Al) and/or silver (Ag), may be used to form the contact layer 220 with further increased reflectivity in accordance with embodiments of the present invention.

Figure 3A:
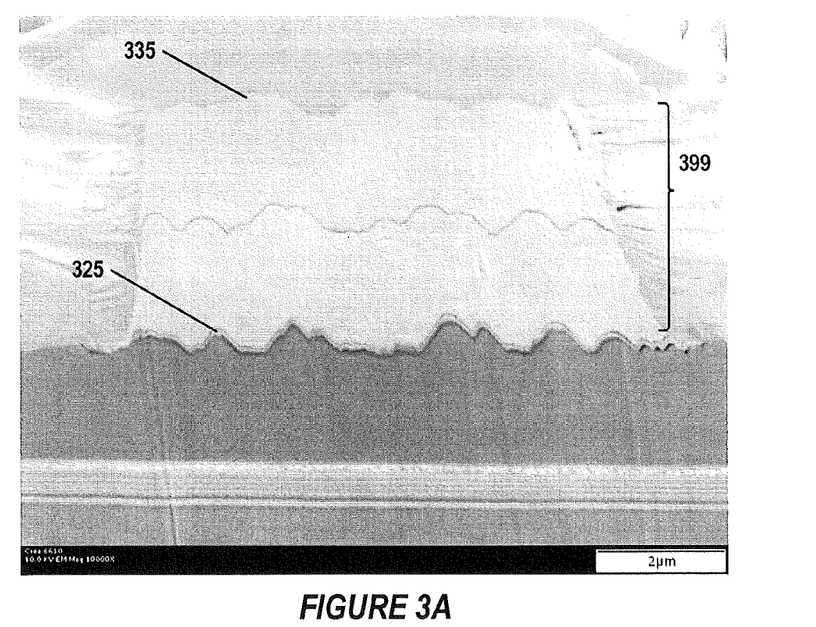
FIGS. 3A and 3B are cross-sectional scanning electron microscope (SEM) images illustrating surface characteristics of conventional contact structures and contact structures in accordance with some embodiments of the present invention, respectively.
Figure 3B:
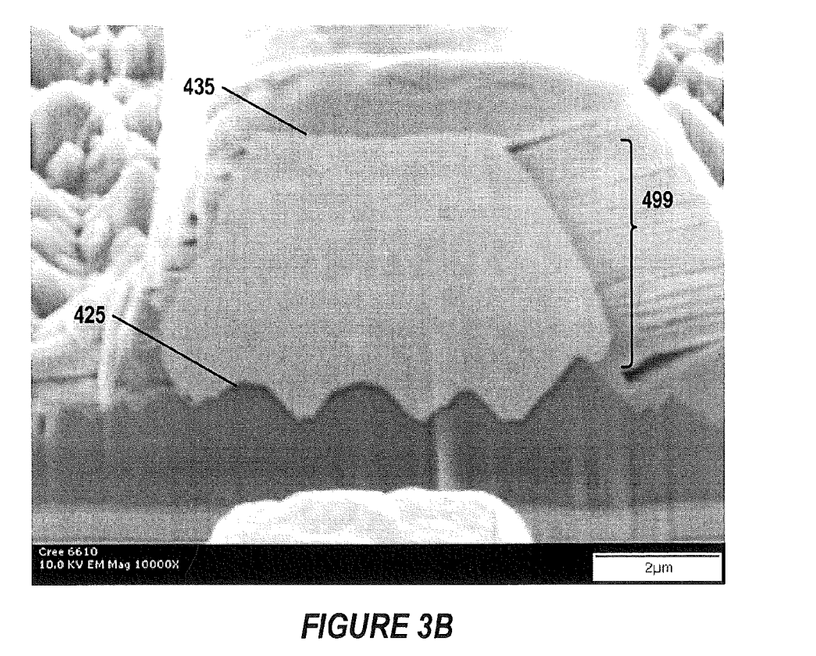
Figure 4A:
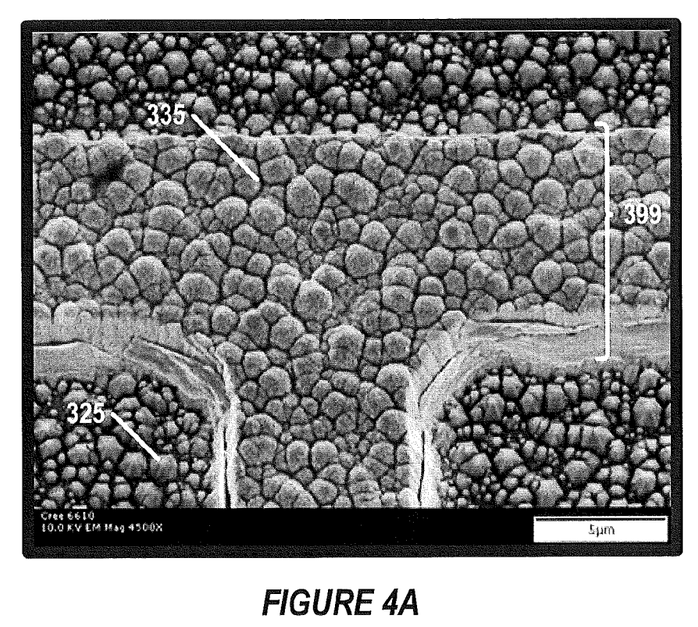
FIGS. 4A and 4B are top view scanning electron microscope (SEM) images illustrating surface characteristics of conventional contact structures and contact structures in accordance with some embodiments of the present invention, respectively.
Figure 4B:
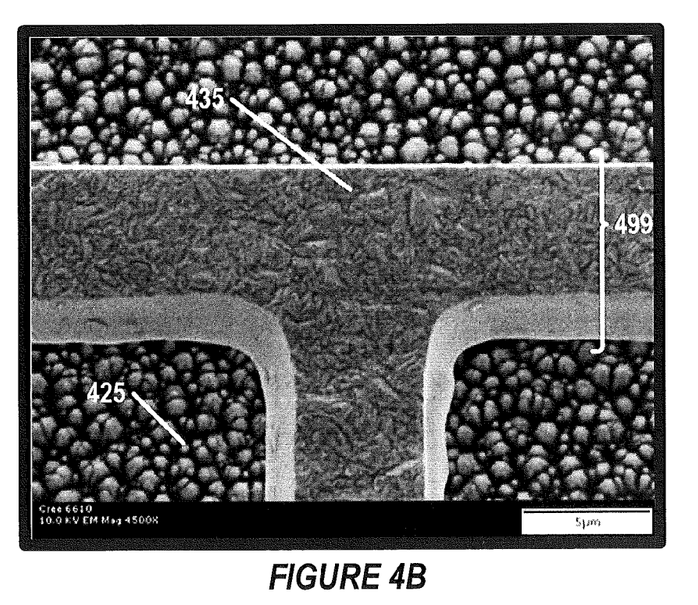

FIGS. 3A and 3B are scanning electron microscope (SEM) images illustrating surface characteristics of a conventional contact structure 399 and contact structures 499 in accordance with some embodiments of the present invention, respectively. FIGS. 4A and 4B are top view scanning electron microscope (SEM) images illustrating surface characteristics of the conventional contact structure 399 and contact structures 499 in accordance with some embodiments of the present invention, respectively. The contact structures of FIGS. 3A-B and 4A-B were formed to similar thicknesses on respective surfaces with similar surface roughnesses. The contact structure 399 shown in FIGS. 3A and 4A was formed using a sputtering or evaporation process, while the contact structure 499 shown in FIGS. 3B and 4B was formed using plating processes as described in detail herein.

As shown in FIGS. 3A and 4A, the surface 335 of the contact structure 399 has a roughness of about 0.384 µm, as defined by a peak-to-valley measurement of the protrusions from the surface 335. As the underlying surface 325 has a roughness of about 0.653 µm (as defined by a peak-to-valley measurement of the protrusions from the surface 325), the surface 335 of the contact structure 399 retains about 58.8% of the surface roughness defined by the features protruding from the underlying surface 325. As such, the contact structure 399 formed by a typical sputtering or evaporation process may have poor reflectivity and/or may otherwise be ineffective in enhancing light extraction.

In contrast, as shown in FIGS. 3B and 4B, contact structures 499 in accordance with embodiments of the present invention provide a significantly reduced surface roughness (and thus, increased reflectivity) as compared to the contact structure 399 shown in FIGS. 3A and 4A. In particular, FIGS. 3B and 4B illustrate that the surface 435 of the contact structure 499 in accordance with embodiments of present invention is substantially planar, having a roughness of about 0.064 µm as defined by a peak-to-valley measurement of the protrusions from the surface 435. As such, the surface 435 of the contact structure 499 has a surface roughness of only about 7.3% of the surface roughness defined by the features protruding from the underlying substrate 425. Accordingly, FIGS. 3B and 4B illustrate that the surface 435 of the contact structure 499 fabricated in accordance with embodiments of the present invention can be made smoother and/or substantially planar despite the surface roughness of the underlying light extraction surface 425, and may thereby provide a reflectivity-enhancing structure on the light extraction surface. In particular, as described in greater detail below, the contact structure 499 may be fabricated using a bi-layer mask and a self-planarizing, low-current density pulse electroplating process.

Figure 5A:
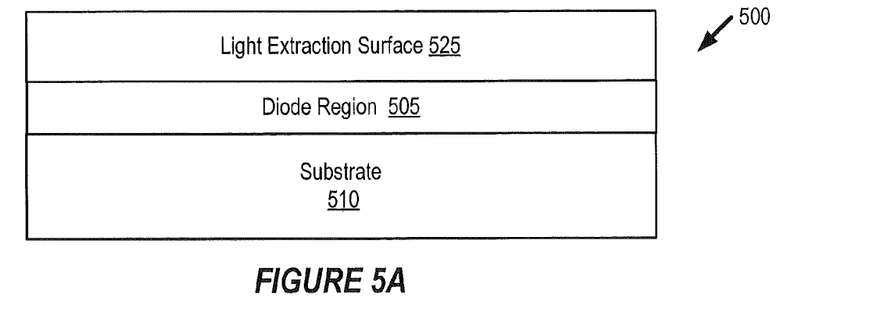
FIGS. 5A-5H are cross-sectional views illustrating methods for fabricating contact structures in accordance with some embodiments of the present invention.

FIGS. 5A-5H are cross-sectional views illustrating methods for fabricating contact structures with improved, reflectivity-enhancing surface characteristics in accordance with some embodiments of the present invention. Referring now to FIG. 5A, an LED wafer 500 including a diode region 505 on a substrate 510 is provided. The diode region 505 includes a light extraction surface 525 thereon. The LED wafer 500 and the layers thereof may correspond to the LED wafer 200 of FIG. 2 and the layers thereof in some embodiments. As such, the diode region 505 includes at least one n-type layer, at least one p-type layer, and an active region therebetween that is configured to provide light emission. For example, the active region may include at least one indium gallium nitride quantum well layer, the n-type layer may include silicon-doped gallium nitride, and the p-type layer may include magnesium-doped gallium nitride in some embodiments, such that radiative recombination of electrons from the n-type layer and holes from the p-type layer may result in photon emission from the active region. The diode region 505 may also be referred to herein as an "LED epi region," because it is typically formed epitaxially on a substrate. Although illustrated as separate from the diode region 505, it will be understood that the light extraction surface 525 may be a surface of the n-type layer or the p-type layer of the diode region 505 in some embodiments. In other embodiments, the light extraction surface 525 may be a surface of a transparent growth substrate (for example, a 4H-SiC substrate) or a transparent carrier substrate (for example, a silicon substrate) including the diode region 505 thereon. In embodiments where the light extraction surface 525 is a surface of a carrier substrate, the substrate 510 may be omitted.

Figure 5B:
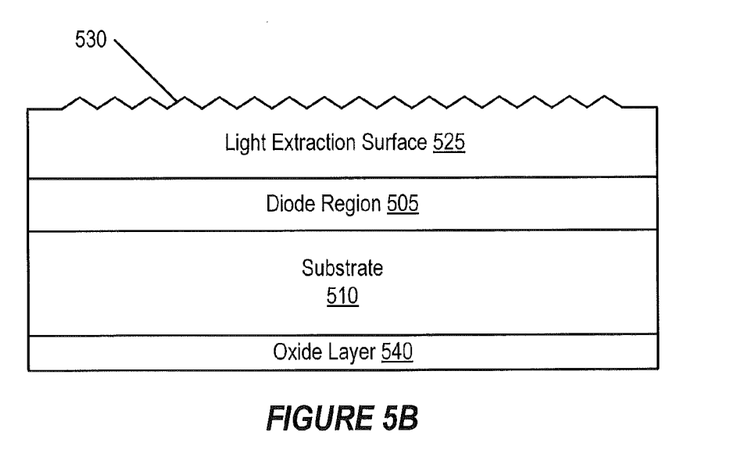

As shown in FIG. 5B, the light extraction surface 525 is patterned, textured, and/or otherwise roughened to define a plurality of light extraction features 530 protruding therefrom. The light extraction features 530 may provide a surface roughness that may enhance light extraction from the diode region 2505 by increasing the probability that incident light emitted by the active region is transmitted through the surface 525 instead of being internally reflected. In some embodiments, the light extraction features 530 may protrude from the light extraction surface 525 by about 0.5 μm to about 6 m, as measured from peak to valley. A masking layer, illustrated as a back-side oxide layer 540, is deposited on a surface of the wafer 500 opposite the light extraction surface 525 to prevent metal deposition thereon during subsequent processes as described herein. In some embodiments, the oxide layer 540 may be deposited to a thickness of about 1200 Å using a sputtering process.

Figure 5C:
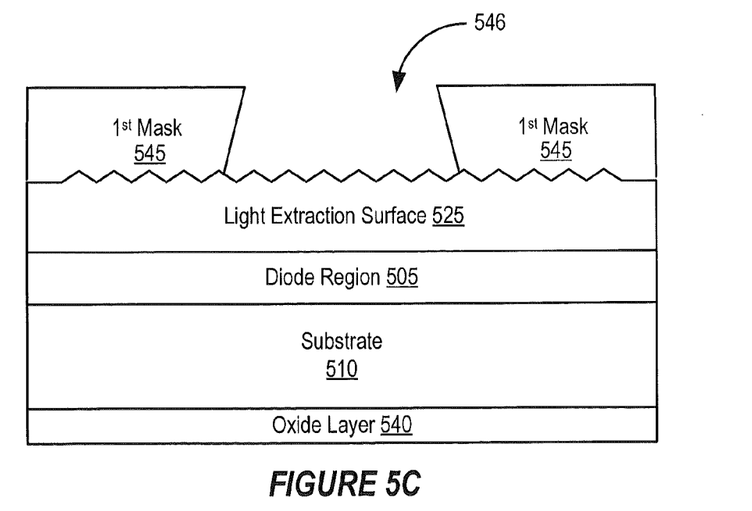
Figure 5D:
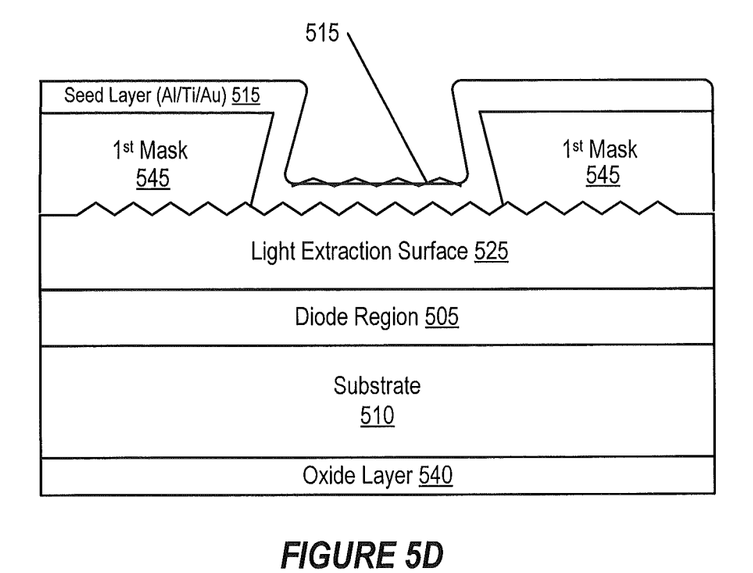

Referring now to FIG. 5C, a first level mask layer 545 is formed and patterned to provide a preliminary opening 546 that exposes a portion of the light extraction surface 525. The first mask layer 545 may be a photoresist layer in some embodiments. As shown in FIG. 5D, a metal seed layer 515 is deposited on the first mask layer 545 and on the portion of the light extraction surface 525 exposed thereby. The seed layer 515 may be conformally deposited by sputtering or evaporation process. The seed layer 515 may include an aluminum layer, a titanium layer, and a gold layer that are sequentially deposited to about 1000 Å each. The seed layer 515 may thereby provide an electrically continuous conductive surface that extends along surfaces of be first mask layer 545 outside the preliminary opening 546, along sidewalls of the preliminary opening 546, and along the exposed light extraction surface 525. It will be understood that the seed layer 515 need not be completely continuous, but rather, provides at least some electrical continuity for the electroplating process. As such, the exact coverage of the seed layer 515 may depend on resist profile, resist thickness, seed layer thickness, deposition method, etc. The portions of the seed layer 515 on the exposed light extraction surface 525 may include a surface 515s that retains at least some of the surface roughness 530 of the underlying light extraction surface 525. For example, the seed layer 515 may have a surface roughness of more than about 50% of the exposed light extraction surface 525 in some embodiments.

Figure 5E:
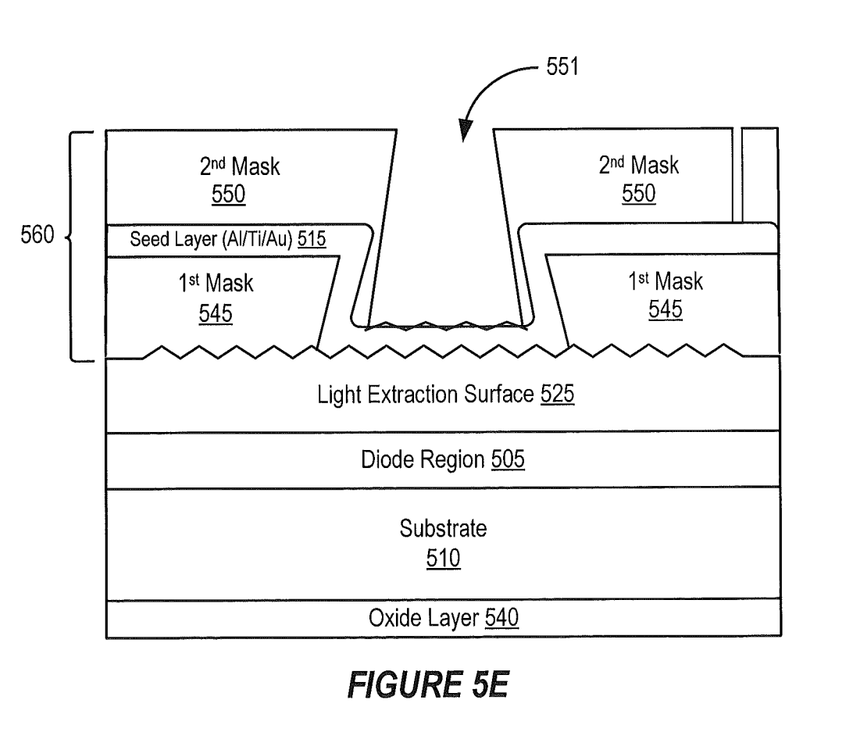

As shown in FIG. 5E, a second level mask layer 550 is formed on the first mask layer 545 including the seed layer 515 thereon and patterned to define an opening 551 exposing a portion of the seed layer 515. The second mask layer 545 may also be a photoresist layer in some embodiments. The second mask layer 550 is negatively biased relative to the first mask layer 545 such that the portions of the seed layer 515 on the sidewalls of the preliminary opening 546 are covered by the second mask layer 550. The first mask layer 545, second mask layer 550, and the seed layer 515 sandwiched therebetween define a bi-layer mask pattern or structure 560. As such, surfaces of the bi-layer mask 560 outside the opening 551 are free of the seed layer 515.

Figure 5F:
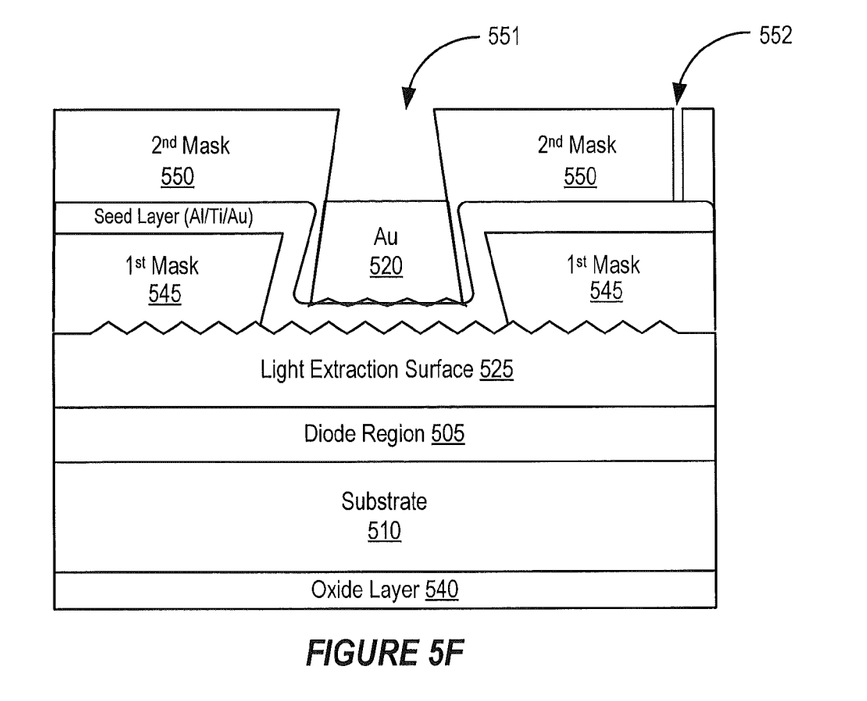

Referring now to FIG. 5F, a plating process is performed to deposit an electrically conductive contact layer 520 (illustrated as a gold layer) in the opening 551 on the exposed portion of the seed layer 515. For example, using a secondary opening 552 in the second mask layer 550, a low current density electroplating process may be performed to deposit the gold contact layer 520 on the exposed portion of the seed layer 515. Because portions of the light extraction surface 525 covered by the first mask layer 545 do not include the seed layer 515 directly thereon, the electroplating process can be performed without damage to the portions of the light extraction surface 525 covered by the first mask layer 545. Also, the presence of the second mask layer 550 on the sidewalls of the preliminary opening 546 of the first mask layer 545 may reduce or prevent plating onto the portions of the seed layer 515 that extend along the sidewalls, thereby reducing the likelihood of void formation in the plated contact layer 520. Accordingly, the plating process may be self-leveling or self-planarizing, resulting in a plated contact layer 520 having a substantially planar surface 535 despite the surface roughness of the underlying layers 515 and/or 525 on which it is formed. The plated contact layer 520 also has opposing sidewalls that are inclined at an angle of less than 90 degrees relative to the surface of the underlying layers, based on the incline of the sidewalls of the opening 551 in the mask structure 560.

Furthermore, because the seed layer 515 is only exposed in the opening 551, the plating process may be performed without depositing the gold contact layer 520 outside the opening 551. In other words, the gold contact layer 520 is not deposited on secondary surfaces of the bi-layer mask 560 outside the opening 551 therein. As such, gold consumption can be reduced by about 90% or more as compared to deposition by evaporation and/or sputtering processes. Furthermore, processes for reclaiming gold deposited on such secondary surfaces may be omitted in accordance with embodiments of the present invention. However, as noted above, the plated contact layer 520 is described herein is not limited to gold or any other particular material. As such, more reflective materials, such as aluminum (Al), silver (Ag), and/or various other metals, may be plated to the exposed portion of the seed layer 515 in some embodiments, and consumption of such materials may likewise be reduced by about 90% or more. In other words, deposition of any electrically conductive contact layer may be enhanced by the plating processes described herein.

Figure 5G:
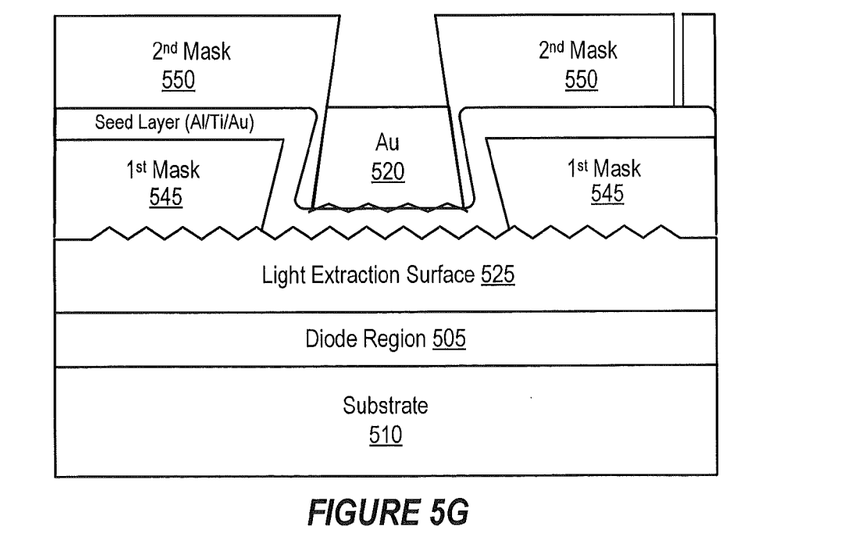
Figure 5H:
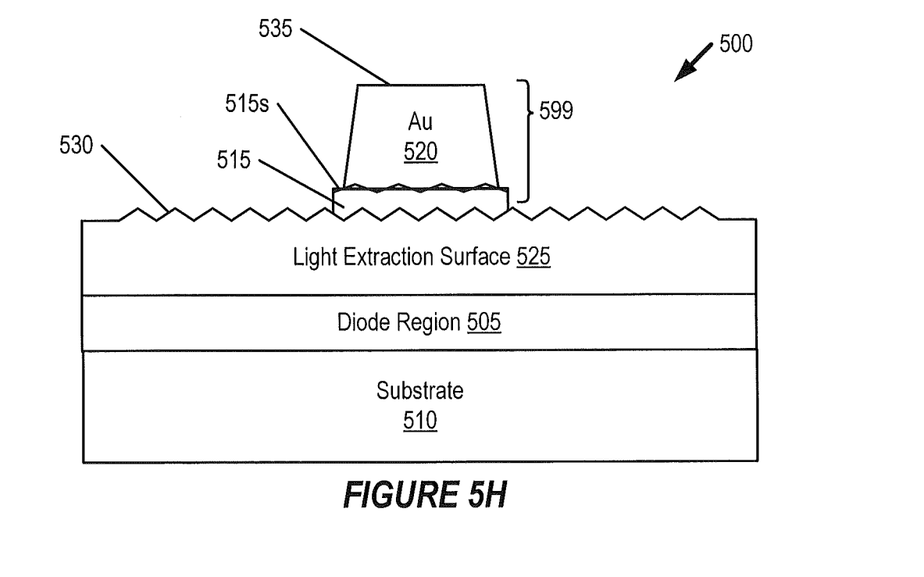

As shown in FIG. 5O, the oxide layer 540 is stripped away to expose the surface of the LED wafer 500 opposite the light extraction surface 525. In some embodiments, the oxide layer 540 may be removed by a wet etching process using a 10:1 buffered oxide etchant (BOE) solution. In FIG. 5I-1, the bi-layer mask 560 is removed, leaving the contact layer 520 and the portion of the seed layer 515 on the light extraction surface 525 to define sublayers of a contact structure 599 in accordance with embodiments of the present invention. For example, both layers 550 and 545 of the bi-layer mask 560 may be removed using a lift-off tool. Methods for removal of the oxide layer 540 and/or the bi-layer mask 560 are well-known in the art and need not be discussed further herein. As such, a plated contact layer 520 having angled or tapered sidewalls (e.g., such that the base of the plated contact layer 520 is wider than the upper surface 535) is provided on a portion of the seed layer 515. The sidewalls of the seed layer 515 may or may not be angled or tapered. In some embodiments, the sidewalls of the seed layer 515 may be inclined a same or different angle than the sidewalls of the plated contact layer 520.

As similarly noted above with reference to FIG. 2, a surface 535 of the plated contact layer 520 opposite the light extraction surface 525 has surface characteristics that differ from and are largely independent of the underlying layers. In particular, the surface 535 of the plated contact layer 520 has a surface roughness that is less than about 10% of that of the patterned light extraction surface 525 and/or that of the deposited seed layer 515. For example, while the light extraction features 530 may protrude by about 0.65 μm from the light extraction surface 525, the surface 535 of the plated contact layer 520 may include features protruding by about only 0.064 μm. As such, the surface 535 of the plated contact layer 520 may be substantially planar and/or otherwise more reflective with respect to light in the wavelength ranges emitted by the diode region 505 than the underlying surface 515s of the seed layer 515 on which the contact layer 520 is formed. Likewise, the surface 535 of the plated contact layer 520 in accordance with embodiments of the present invention may have a reduced surface roughness and/or may otherwise provide a greater reflectivity than that of a contact layer formed on the seed layer 515 by a sputtering and/or evaporation process. In other words, the surface 535 of the plated contact layer 520 may be substantially free of the surface roughnesses of the underlying layers 515s and/or 525 when formed in accordance with embodiments of the present invention, for example, due to the self-leveling provided by the plating process. While illustrated as a gold (Au) contact layer 520 on a Al/Ti/Au seed layer 515, other materials, including more reflective metals such as Al and/or Ag, may also be used to form a contact layer structure 599 with increased reflectivity. Furthermore, although illustrated in FIGS. 5A-5H as being formed on a light extraction surface 525, it will be understood that the fabrication methods described herein may be more generally be applied to form a conductive contact structure 599 including at least one plated layer on any surface of a light emitting device, as described in greater detail below.

Figure 6A:
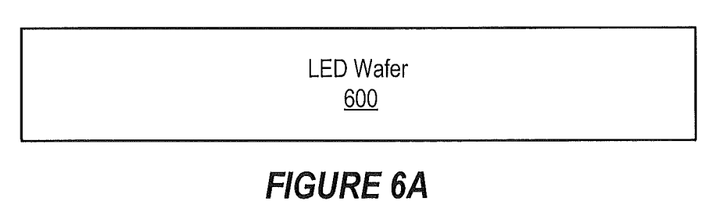
FIGS. 6A-6E are cross-sectional views illustrating methods for fabricating contact structures with improved surface characteristics in accordance with further embodiments of the present invention.

FIGS. 6A-6E are cross-sectional views illustrating methods for fabricating contact structures with improved surface characteristics in accordance with further embodiments of the present invention. Referring now to FIG. 6A, an LED wafer 600 including a diode region therein is provided. The diode region includes at least one n-type layer, at least one p-type layer, and an active region therebetween that is configured to provide light emission. For example, the active region may include at least one indium gallium nitride quantum well layer, the n-type layer may include silicon-doped gallium nitride, and the p-type layer may include magnesium-doped gallium nitride in some embodiments, such that radiative recombination of electrons from the n-type layer and holes from the p-type layer may result in photon emission from the active region. The diode region may also be referred to herein as an "LED epi region," because it is typically formed epitaxially on a substrate.

Figure 6B:
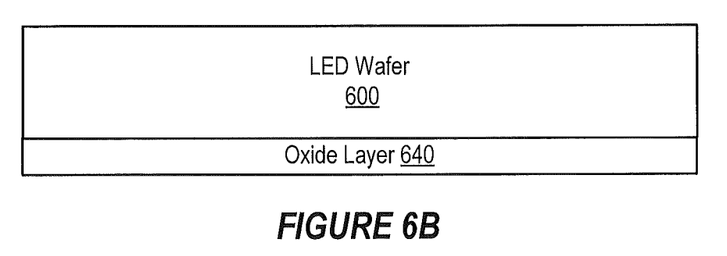

As shown in FIG. 6B, a masking layer, illustrated as a back-side oxide layer 640, is deposited on a lower surface of the wafer 600 to prevent metal deposition thereon during subsequent processes as described herein. In some embodiments, the oxide layer 640 may be deposited to a thickness of about 1200 Å using a sputtering process.

Figure 6C:
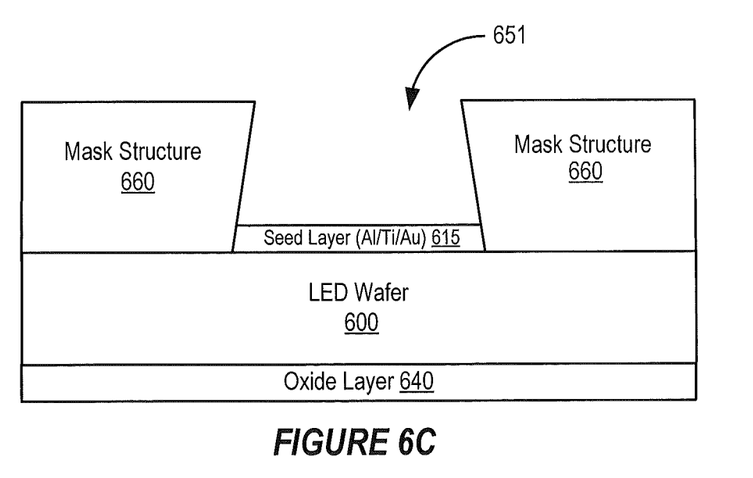

Referring now to FIG. 6C, a mask structure 660 is formed and patterned to provide an opening 651 that exposes a surface of the wafer 600. The mask structure 660 may be a photoresist layer in some embodiments. In some embodiments, the mask structure 660 may be a bi-layer mask structure, such as the bi-layer mask structure 560 of FIG. 5E. As such, a metal seed layer 615 is deposited on the surface of the wafer 600 exposed by the opening 651 in the mask structure 660 such that the sidewalls and/or surfaces of the mask structure 660 outside the opening 651 may be free of the seed layer 615 (for example, due to coverage provided by a sublayer of the mask structure). The seed layer 615 may include an aluminum layer, a titanium layer, and a gold layer that are sequentially deposited to about 1000 Å each.

Figure 6D:
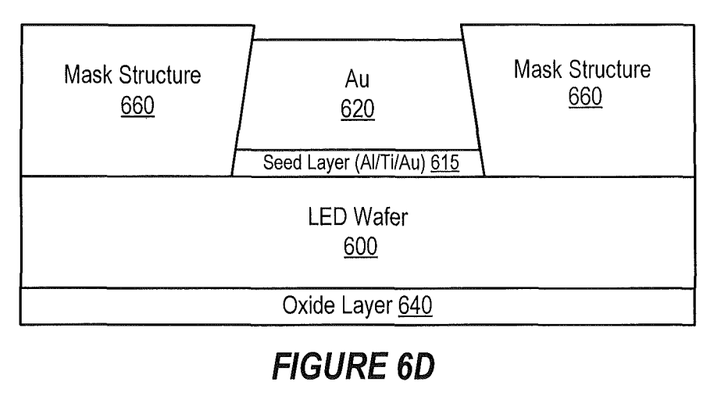

As shown in FIG. 6D, a plating process is performed to deposit an electrically conductive contact layer 620 (illustrated as a gold layer) in the opening 651 on the seed layer 615. For example, a low current density electroplating process may be performed to deposit the gold contact layer 620. The electroplating process may be self-leveling or self-planarizing, resulting in a plated contact layer 620 having a substantially planar surface 635. As such, the surface roughness of the plated contact layer 620 may be independent of that of the underlying surface of the seed layer 615 and/or the LED wafer 600 thereon.

Figure 6E:
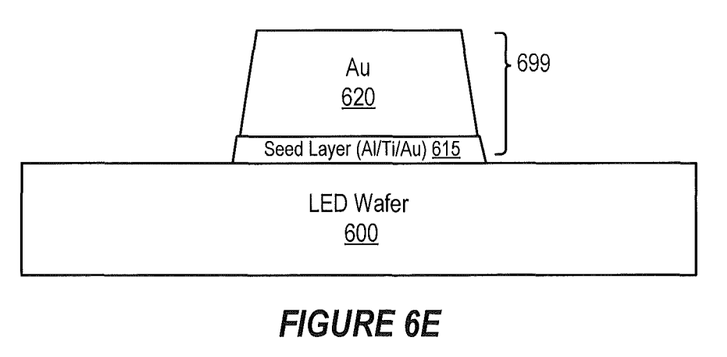

Referring now to FIG. 6E, the oxide layer 640 is stripped away to expose the surface of the LED wafer 600 opposite the plated contact layer 620, for example, by a wet etching process using a 10:1 buffered oxide etchant (BOE) solution. The mask structure 660 is also removed (for example, using a lift-off tool), leaving the plated contact layer 620 and the seed layer 615 on the surface of the wafer 600 to define sublayers of a contact structure 699 in accordance with embodiments of the present invention. Due to the fabrication methods described herein, one or more of the sublayers 615 and 620 of the contact structure 699 has sidewalls that are inclined at an angle (for example, corresponding to that of the mask structure 660), and a surface 635 of the plated contact layer 620 has surface characteristics that differ from and are independent of those of the underlying layers, as similarly discussed above with reference to the contact layers 220 and 520 of FIGS. 2 and 5A-5H, respectively.

Although described herein primarily with reference to the plating of Au contact layers on Al/Ti/Au seed layers, it will be understood that contact structures as described herein may include other metals, including but not limited to gold, silver, tungsten, palladium, rhenium, copper, titanium, platinum, chromium, nickel, aluminum, and/or alloys of these metals. Also, while illustrated with reference to a single plated contact layer, plated contact layers in accordance with embodiments of the present invention may include multiple plated layers, including barrier layers for reducing or eliminating diffusion through the plated layers. The plated contact layers as described herein may further include relatively thick metal layers or alloys for improved current spreading along with barrier metals or reflective layers or combinations thereof. One or more seed layers for improved plating layer adhesion, such as titanium, titanium tungsten alloys, chromium, nickel, and/or platinum may also be used as a base for plating one or more subsequent contact layers. It will therefore be understood that contact structures in accordance with embodiments of the present invention may include any and all combinations of the metals described above.

Furthermore, although illustrated in FIGS. 5H and 6E as having inclined or angled sidewalls, it will be understood that contact structures in accordance with embodiments of the present invention may have other shapes, for example, depending on the mask configuration used to define the contact structures and/or the sublayers thereof. For instance, although illustrated as having a base that is wider than an upper surface, a plated contact layer may have an upper surface that is wider than a base thereof without departing from the teachings of the present inventive concept. More generally, although illustrated with reference to specific shapes, variations in the shapes of contact structures and/or sublayers thereof in accordance with embodiments of the present invention may be possible depending on the manufacturing techniques used.

Accordingly, various embodiments described herein improve surface characteristics (such as roughness and reflectivity) as well as reduce metal consumption in the fabrication of LED contact structures. Production efficiency and/or luminous efficiency may thereby be improved.

Some embodiments have been described generally herein with reference to gallium nitride (GaN)-based light emitting diodes, which may be epitaxially grown on silicon carbide (SiC)-based growth substrates, for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, as shown above, the growth substrate may not be present in the finished product. For example, the growth substrate may be removed after forming the light emitting diode, and a carrier substrate may be bonded to the light emitting diode after removing the growth substrate. In some embodiments, the LEDs may be configured to operate such that light emission occurs through the growth or carrier substrate. Also, the substrate and/or the epitaxial layers may be patterned so as to enhance light output of the devices. Furthermore, phosphor coated LEDs may also be suitable for use in embodiments of the present invention. Embodiments of the present invention can be applied to standard mesa-type LED devices, vertical LED devices, flip chip LED devices, and/or LED devices provided on conductive substrates. In some embodiments, the light emitting diodes may be gallium nitride-based LED devices manufactured and sold by Cree, Inc. of Durham, N.C.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A light emitting device, comprising:
   an active layer configured to provide light emission;
   a light extraction surface comprising protruding features on the active layer; and
   an electrically conductive contact structure comprising at least one plated contact layer on the protruding features of the light extraction surface and a conductive seed layer therebetween,
   wherein a surface of the plated contact layer is substantially free of a surface roughness defined by the protruding features of the light extraction surface, and wherein the surface of the plated contact layer has a greater reflectivity with respect to the light emission than a surface of the conductive seed layer that is opposite the protruding features of the light extraction surface.

2. The device of claim 1, wherein the conductive seed layer comprises at least one sputtered or evaporated layer between the plated contact layer and the protruding features of the light extraction surface on the active layer.

3. The device of claim 2, wherein the conductive seed layer conforms to the surface roughness defined by the protruding features of the light extraction surface on the active layer, and wherein the surface of the plated contact layer is opposite the conductive seed layer.

4. The device of claim 3, wherein a surface roughness of the surface of the conductive seed layer that is opposite to the light extraction surface is more than about 50% of that of the light extraction surface, and wherein a surface roughness of the surface of the plated contact layer is less than about 10% of that of the light extraction surface on the active layer.

5. A light emitting device, comprising:
   an active layer configured to provide light emission;
   a surface on the active layer; and
   an electrically conductive contact structure comprising at least one plated contact layer on the surface, wherein a base of the plated contact layer adjacent the active layer is wider than a surface of the plated contact layer opposite the active layer,
   wherein the surface on the active layer includes a plurality of features protruding therefrom by more than about 0.5 micrometers (μm), and wherein the plated contact layer has a thickness of about 8 micrometers (μm) or less, and wherein a surface of the plated contact layer opposite the active layer has a surface roughness of less than about 10% of that of the surface on the active layer.

6. The device of claim 1, wherein the light extraction surface comprises a surface of an epitaxial layer or a surface of a substrate including the active layer thereon.

7. The device of claim 2, wherein the plated contact layer comprises gold or an alloy thereof.

8. The device of claim 7, wherein the conductive seed layer comprises a layer of gold or an alloy thereof.

9. The device of claim 8, wherein the conductive seed layer further comprises a layer of titanium or an alloy thereof between the layer of gold and the light extraction surface on the active layer.

10. The device of claim 9, wherein the conductive seed layer further comprises a layer of aluminum or an alloy thereof between the titanium layer and the light extraction surface on the active layer.

11. The device of claim 5, wherein the plated contact layer comprises a stack including multiple plated layers.

12. The device of claim 11, wherein the plated contact layer further comprises respective barrier layers between adjacent ones of the multiple plated layers in the stack.

13. The device of claim 11, wherein the multiple plated layers respectively comprise gold, silver, tungsten, palladium, rhenium, copper, titanium, platinum, chromium, nickel, aluminum, and/or alloys thereof.

14. The device of claim 2, wherein the conductive seed layer comprises a stack including multiple layers, and wherein the multiple layers respectively comprise titanium, tungsten, chromium, nickel, platinum, and/or alloys thereof.

15. The device of claim 1, wherein at least one sidewall of the plated contact layer is inclined relative to the light extraction surface on the active layer.

16. A light emitting device, comprising:
an active layer configured to provide light emission;
a surface on the active layer, the surface comprising a plurality of features protruding therefrom; and
an electrically conductive contact structure comprising at least one plated contact layer on the protruding features of the surface and a conductive seed layer therebetween, wherein a surface of the plated contact layer opposite the active layer has a surface roughness of less than about 10% of that of the surface on the active layer, wherein the surface of the plated contact layer has a greater reflectivity with respect to the light emission than a surface of the conductive seed layer that is opposite the features protruding from the surface on the active layer, and wherein a base of the plated contact layer adjacent the active layer is wider than the surface of the plated contact layer opposite the active layer.

17. The device of claim 16, wherein the conductive seed layer comprises at least one sputtered or evaporated metal layer between the plated contact layer and the features protruding from the surface on the active layer.

18. The device of claim 16, wherein the conductive seed layer has a thickness of about 0.3 micrometers ($\mu$m) or less, and wherein the plated contact layer is a substantially planar layer having a thickness of about 8 micrometers ($\mu$m) or less.

19. The device of claim 16, wherein the surface of the conductive seed layer has a surface roughness of more than about 50% of that of the surface on the active layer.

20. The device of claim 1, wherein the surface of the plated contact layer comprises a first surface and wherein:
a second surface of the plated contact layer, which is opposite the first surface and is adjacent the protruding features of the light extraction surface on the active layer, conforms to the surface roughness.

21. The device of claim 2, wherein portions of the light extraction surface surrounding the plated contact layer are free of the conductive seed layer.

22. A light emitting device, comprising:
an active layer configured to provide light emission;
a light extraction surface comprising protruding features on the active layer; and
an electrically conductive contact structure comprising at least one plated contact layer on the protruding features of the light extraction surface and a conductive seed layer therebetween,
wherein a surface of the plated contact layer opposite the light extraction surface is substantial free of a surface roughness by the protruding features of the light extraction surface, and has a greater reflectivity with respect to the light emission than a surface of the conductive seed layer opposite the light extraction surface, and
wherein the plated contact layer on the protruding features of the light extraction surface is substantially free of voids therein.

* * * * *